United States Patent [19]
Sugiyama

[11] 3,934,331
[45] Jan. 27, 1976

[54] METHOD OF MANUFACTURING SEMICONDUCTOR DEVICES

[75] Inventor: Masayoshi Sugiyama, Hitachi, Japan

[73] Assignee: Hitachi, Ltd., Japan

[22] Filed: Jan. 2, 1975

[21] Appl. No.: 537,962

Related U.S. Application Data

[63] Continuation of Ser. No. 343,038, March 20, 1973, abandoned.

[30] Foreign Application Priority Data

Mar. 21, 1972 Japan................................ 47-27454

[52] U.S. Cl. ........................ 29/583; 29/590; 357/90
[51] Int. Cl.² ........................................ B01J 17/00
[58] Field of Search ........ 29/583, 590, 589; 357/88, 357/90

[56] References Cited
UNITED STATES PATENTS

| 380,805 | 4/1974 | Henning | 29/583 |
|---|---|---|---|
| 3,343,255 | 9/1967 | Donovan | 29/590 |
| 3,360,696 | 12/1967 | Neilson | 357/89 |
| 3,542,266 | 11/1970 | Woelfle | 29/583 |
| 3,608,186 | 9/1971 | Hutson | 29/583 |

Primary Examiner—W. Tupman
Attorney, Agent, or Firm—Craig & Antonelli

[57] ABSTRACT

A method of manufacturing semiconductor devices comprising a semiconductor element having a PN junction in which an N⁺-type region is formed in an N-type region constituting the PN junction and another N-type region is formed around the N⁺-type region and a metal layer is provided on the other N-type region and the N⁺-type region, thereby providing a mechanically and electrically improved ohmic contact to the semiconductor element.

5 Claims, 12 Drawing Figures

FIG. 1 PRIOR ART
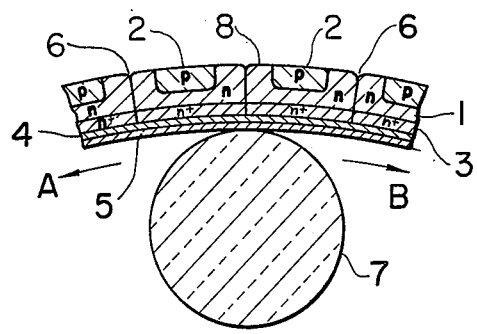
FIG. 2 PRIOR ART
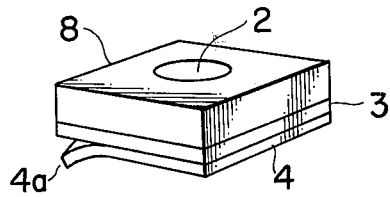
FIG. 3a
FIG. 3b
FIG. 3c

METHOD OF MANUFACTURING SEMICONDUCTOR DEVICES

CROSS REFERENCE TO RELATED APPLICATIONS

This is a continuation application of U.S. application Ser. No. 343,038 filed Mar. 20, 1973, now abandoned.

BACKGROUND OF THE INVENTION

1. Field of the Invention

This invention relates to a method of manufacturing semiconductor devices in which there is a strong electrical and mechanical bond between the semiconductor element and the supporting electrode.

2. Description of the Prior Art

In order to achieve superior ohmic contact between a semiconductor element and its electrode, it is common practice in the manufacture of the semiconductor to deposit a metal layer of aluminum, chromium or nickel on one of the main surfaces of the semiconductor where the electrode is to be provided. On the other hand, the impurity concentration in the surface of the semiconductor where the metal layer is to be provided is increased to form therein an N-type or P-type high concentration surface layer.

The bond or adhesion of the metal layer to the N-type high concentration surface layer is very weak in a certain direction, and it is known that the metal layer tends to be peeled off from the semiconductor element by the mechanical stresses which may be applied thereto in the processes of manufacture thereof.

The inventor has made a study of the causes of the peeling off of the metal layer and has discovered the fact mentioned below.

The surface of the N-type high concentration layer is oversupplied with electrons which adsorb ions of impurities prior to the depositing of the metal layer, resulting in a lower adhesive or bonding power. When phosphorus is used as a doping material for the N-type high concentration layer, the surface of the semiconductor element is transformed into $P_2O_5$ by heat applied at the time of doping. This $P_2O_5$ absorbs much water, causing the unsatisfactory adhesive or bonding power of the metal layer.

Also, it has been ascertained that the peeling off of the metal layer occurs especially when required PN junctions are formed in a semiconductor wafer, followed by the pelletization of the wafer to obtain a plurality of semiconductor elements.

In the manufacture of semiconductor elements of 0.5 to 1.5 mm by 0.5 to 1.5 mm, for example, the masking tape method is now in use to attain an improved operating efficiency of scribe-cut and sorting work. In this masking tape method, special stress is applied to the metal layer, often causing it to be peeled off.

SUMMARY OF THE INVENTION

Accordingly, it is an object of the present invention to provide a method of manufacturing semiconductor devices with desirable electrical characteristics and reliability which has an ohmic contact between the semiconductor element and its electrode.

Another object of the invention is to provide a method of manufacturing semiconductor devices with high production yield, in which the metal layer providing the ohmic contact between the semiconductor element and its electrode is not peeled off from the semiconductor element.

Still another object of the invention is to provide a method of manufacturing semiconductor devices which eliminates the need for excessive care taken not to peel off the metal layer during the manufacturing processes including the scribe-cut and the taking off of the semiconductor elements from the masking tape.

According to the present invention, the N-type high concentration surface region provided for the purpose of obtaining an ohmic contact is limited or controlled by an adjacent N-type low-concentration surface layer surrounding the N-type high concentration region, which N-type low-concentration surface layer is closely adhered to the metal layer thereby to prevent not only the peeling off of the metal layer but breakage of the semiconductor element.

BRIEF DESCRIPTION OF THE DRAWING

FIG. 1 is a diagram showing a conventional semiconductor wafer in which semiconductor elements are formed.

FIG. 2 is a perspective view of a semiconductor element obtained from the wafer of FIG. 1.

FIGS. 3a, 3b and 3c are longitudinal sectional diagrams of a semiconductor wafer showing the processes of the manufacture of the semiconductor device according to the invention.

DESCRIPTION OF THE PREFERRED EMBODIMENTS

Figure 4:
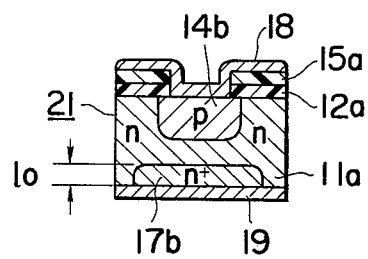
FIG. 4 is a longitudinal sectional diagram showing a semiconductor element of the semiconductor device according to the invention which is obtained from the manufacturing processes explained with reference to FIGS. 3a, 3b and 3c.

For better understanding of the invention reference is first made to FIGS. 1 and 2 to further explaine prior art devices. In order to obtain diodes of planar type from a semiconductor wafer 1 of starting N-type conductivity, a P-type doping material is diffused in the semiconductor wafer 1 at predetermined intervals in such a manner as to form a plurality of PN junctions exposed on one of the main surfaces of the wafer 1 thereby to produce a plurality of independent regions 2 of P-type conductivity, while in the other main surface are formed the N-type high concentration surface layers 3 with an impurity concentration of $1 \times 10^{19 \text{ to } 21}$ atoms/cm$^3$ or thereabouts. A layer 4 of, say, aluminum is deposited by evaporation or plated on the N-type high concentration surface layers 3. Also, the aluminum layer 4 is covered with the masking tapes 5, after forming grooves 6 for scribe-cutting between the plurality of independent P-type regions 2.

The semiconductor wafer 1 of the above-described construction is disposed on a jig including a roller 7 and is driven in both directions A and B while being pressed against the roller 7. As a result, the semiconductor wafer 1 is scribe-cut along the grooves 6. After that, the masking tape 5 is subjected to the tensile strength both in longitudinal and transverse directions, and the resulting extension of the masking tape 5 allows a worker attending the assembly line to take off semiconductor elements 8 from the masking tape 5. Since the scribe-cutting operation is performed not only in the directions A and B as shown in FIG. 1 but also in the directions at right angles to the directions A and B by the movement of the semiconductor wafer 1 in the directions at right angles to A and B, the semiconductor element 8 is subjected to the mechanical stress at the four corners of its surface where the aluminum layer 4 is covered, so that the aluminum layer 4 tends to be peeled off at the four corners as shown by 4a in FIG. 2.

The semiconductor element 8 comprises in many cases germanium or silicon as its main component which is generally so brittle that the four corners of the semiconductor element 8 are often broken off due to the mechanical stress at the time of scribe-cutting operation or the peeling off from the masking tape. This undesirable situation may be prevented if the metal layer is tightly adhered to the semiconductor element to compensate for the brittleness of the semiconductor element.

Such peeling off of the metal layer does not provide for a sufficient contact area and causes the breakage of the semiconductor itself, thereby constituting major factors for inferior electrical characteristics, reliability and yield of the semiconductor devices.

Now, reference is made FIGS. 3a–3c. In order to obtain a diode of planar type from the semiconductor wafer 11 of starting N-type conductivity, silicon dioxide films 12a and 12b are deposited on the main surfaces of the semiconductor wafer 11 as shown in FIG. 3a. The silicon dioxide film 12a on one of the main surfaces is etched at regular spatial intervals in a circle thereby to form apertures 13a, 13b and 13c, by way of which the semiconductor wafer 11 is exposed. Also, through the apertures 13a, 13b and 13c, a P-type doping material such as boron is diffused to form P-type regions 14a, 14b and 14c.

For the purpose of forming an N-type high concentration surface region to achieve an ohmic contact with the electrode, silicon dioxide films 15a and 15b are deposited on the silicon dioxide films 12a and 12b of the semiconductor wafer 11 as shown in FIG. 3b, thereby to close the apertures 13a, 13b and 13c and hence the exposed portions of the semiconductor wafer 11. The silicon dioxide films 12b and 15b on the other main surface are etched to form apertures 16a, 16b and 16c, through which the semiconductor wafer 11 is exposed and an N-type doping material such as phosphorus is diffused to form the N-type high concentration surface regions 17a, 17b and 17c.

The relationship between the N-type conductivity of the semiconductor wafer 11 and the impurity concentration of the N-type high concentration surface regions 17a, 17b and 17c will be explained in detail later. By way of explanation, the impurity concentrations in the semiconductor wafer 11 and the N-type high concentrations furface region are $1 \times 10^{15}$ atoms/cm$^3$ and $1 \times 10^{19\text{-}20}$ atoms/cm$^3$ respectively, in one example.

In FIG. 3a, the symbol $n^+$ shown in the N-type high concentration surface regions 17a, 17b and 17c indicates that these regions are higher in impurity concentration than the N-type regions (shown by $n$) of the semiconductor wafer 11 with respect to the N-type conductivity.

Part of the silicon dioxide films 12a and 15a in the upper main surface of the semiconductor wafer 11 and the silicon dioxide films 12b and 15b in the lower main surface thereof is removed, and in that place are formed by, say, evaporation metal layers 18 and 19 of aluminum. The resulting assembly is shown in FIG. 3c. It has been already mentioned that the aluminum layers 18 and 19 as well as the N-type high concentration regions 17a, 17b and 17c are provided for the purpose of achieving an ohmic contact.

In order to effect the scribe-cutting, grooves 20a and 20b are formed in the aluminum layer 18 and the masking tape (not shown) is attached to the aluminum layer 19 thereby to scribe along the grooves 20a and 20b. Then the semiconductor wafer 11 is processed on the roller as described with reference to FIG. 1 to cut the wafer into a plurality of semiconductor elements 21 as shown in FIG. 4.

The semiconductor element 21 is provided with the N-type high concentration region 17b in one of its main surfaces where electrodes (not shown) are formed, and this region 17b is surrounded by an adjacent N-type low concentration region 11a.

Explanation will be made now of the impurity concentrations in the N-type low concentration surface regions 11a and in the N-type high concentration surface regions 17a, 17b and 17c of the semiconductor wafer 11 in connection with the bonding power between the semiconductor element and the metal layer.

Figure 8:
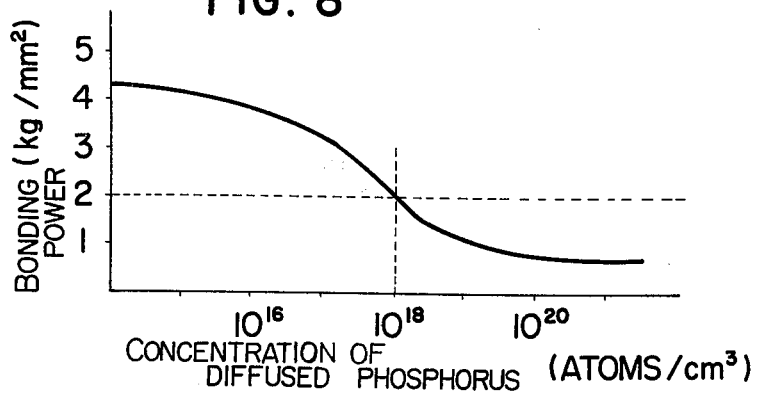
FIG. 8 is a diagram showing the relationship between the impurity concentration of the N-type conduction layer of the semiconductor element doped with phosphorus and the bonding or adhesive power between the semiconductor element and the metal layer.

The diagram of FIG. 8 shows the bonding power between the semiconductor element and the metal layer as related to the concentration of phosphorus which is an impurity employed in this case to form the N-type high concentration surface regions 17a, 17b and 17c.

In the diagram, the horizontal dashed line shows a reference level of 2 kg/mm$^2$ in bonding power employed when using a masking tape. The metal layer is peeled off from the semiconductor element below this reference level. As is apparent from this drawing, the metal layer is peeled off at the time of scribe-cutting with the masking tape, if the concentration of phosphorus impurity exceeds $1 \times 10^{18}$ atoms/cm$^3$.

In other words, it is at an impurity concentration of $1 \times 10^{18}$ atoms/cm$^3$ or less that the metal layer will not be peeled off from the semiconductor element. It was already mentioned that according to an embodiment of the present invention the impurity concentrations in the N-type low concentration region and the N-type high concentration surface region are $1 \times 10^{15}$ atoms/cm$^3$ and $1 \times 10^{19 \text{ to } 20}$ atoms/cm$^3$ respectively whereby it is possible to achieve an electrical and mechanical close bond or ohmic contact between the semiconductor element and the metal layer.

According to the method of manufacture described above, the N-type low concentration region 11a is obtained without any special processes by the use of the initial block of the semiconductor wafer 11 of the N-type conductivity.

Figure 5:
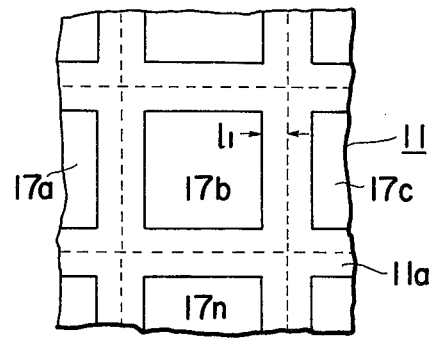
FIG. 5 is a plan of the semiconductor wafer of FIG. 3b taken in the line V—V.

The basic arrangement of the N-type low concentration region 11a and the N-type high concentration regions 17a, 17b and 17c is as shown in FIG. 5. It is noted from the drawing that the N-type high concentration regions 17a, 17b, 17c, . . . 17n which are substantially square are surrounded by the checkered N-type low concentration regions 11a.

Figure 6:
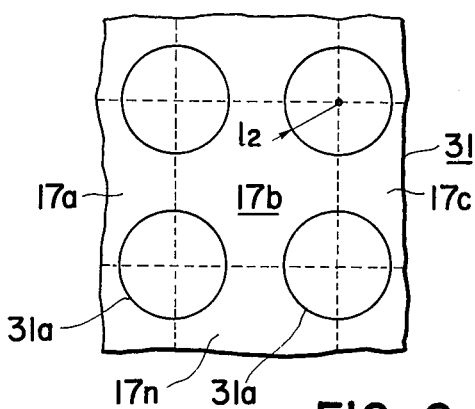
FIG. 6 is a diagram showing a modification of the semiconductor wafer shown in FIG. 5.

Reference is had to FIG. 6 showing a modification of the embodiment of FIG. 5. In view of the fact that the semiconductor element tends to be peeled off at its four corners, flat circular N-type low concentration regions 31a are provided at predetermined regular spatial intervals in such a manner that the center of each of the regions 31a is located at a corner of the semiconductor element. In this way, each N-type low concentration region 31a is divided into four fanshaped portions by the scribe-cutting thereby to form the four corners of each semiconductor element. Each of the fan-shaped portions of the N-type low concentration regions 31a is adhered to the metal layer, thus achieving the same advantage as in the embodiment of FIG. 5 as if each of the N-type high concentration regions is surrounded in its entirety by an N-type low concentration region.

Figure 7:
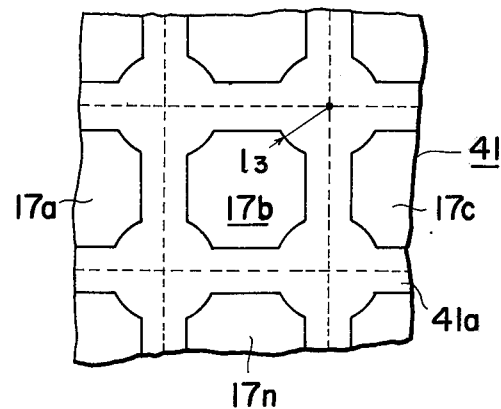
FIG. 7 is a plan of another modification of the semiconductor wafer shown in FIG. 5.

The bonding power between the semiconductor element and the metal layer is further strengthened in the embodiment of FIG. 7 where the arrangement of FIG. 5 and that of FIG. 6 are combined to put greater emphasis on the four corners of the N-type high concentration surface region.

The dashed lines passing through the N-type low concentration regions in FIGS. 5 to 7 show boundaries between the semiconductor elements into which the semiconductor wafers 11, 31 and 41 are scribe-cut.

It is apparent that the larger the area of the N-type low concentration regions 11a, 31a and 41a the greater the bonding power between the metal layer and each semiconductor element. But this in turn lessens the area of the N-type high concentration surface region, so that the resistance in the N-type high concentration region is lower than that in the N-type low concentration region, with the result that approximately 95 percent of the electric current flows undesirably in the N-type high concentration surface region, thereby generating heat. It is necessary to take into consideration the abovementioned fact in determining the area of the N-type low concentration region. The results of the inventors study as to the desirable relationship between the areas of the N-type high concentration region and the N-type low concentration region are shown below.

In the embodiment of FIG. 5, a sufficient bonding power is obtained if $l_1 \geqq l_o$, where $l_o$ is the depth of the N-type high concentration surface region as shown in FIG. 4 and $l_1$ is the width of the N-type low concentration region.

In like manner, a sufficiently high bonding power results if $l_2 > l_o$ and $l_3 \geqq l_o$ in the embodiments of FIGS. 6 and 7 respectively, where $l_2$ and $l_3$ are the radii of the N-type low concentration regions for the embodiments of FIGS. 6 and 7 respectively.

Figure 9:
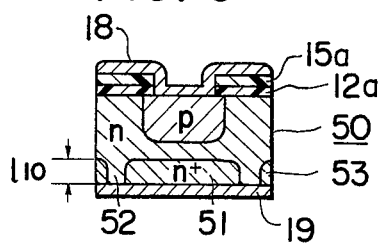
FIG. 9 is a longitudinal sectional diagram of a semiconductor element showing another embodiment of the invention.

Another embodiment of the invention is illustrated in FIG. 9. This embodiment has been developed based on the fact that most of the electric current flows in the N-type high concentration surface region and that the bonding power of a P-type conductivity region to the metal layer is higher than that of the N-type low concentration region.

Figure 10:
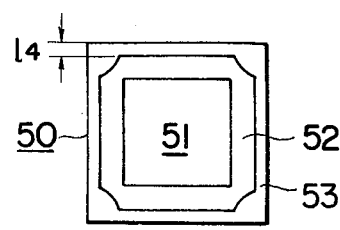
FIG. 10 is a plan as viewed from the N-type conductivity layer of the semiconductor element of FIG. 9.

In the embodiment under consideration, the N-type high concentration region 51 is surrounded by the N-type low concentration region 52 and further by the P-type conductivity region 53 adjacent to the N-type low concentration region 52. Also, the four corners of the semiconductor element 50 has a large area as shown in FIG. 10 thereby to increase the bonding power between the metal layer and the semiconductor element.

In this embodiment, a sufficient bonding power is obtained if the width $l_4$ of the P-type conductivity region 53 is not less than the depth $l_{10}$ of the N-type high concentration surface region 51.

Efficient operation of the semiconducotr element 50 is in no way adversely affected by the presence of the P-type conductivity region 53, the bonding power being higher the the higher the impurity concentration of the P-type conductivity region 53.

It will also be easily understood that the P-type conductivity region 53 may take a shape similar to that of the N-type low concentration region shown in FIG. 5 or FIG. 6 or other appropriate shape not shown in the accompanying drawings.

Although the above explanation was made with reference to the diode of planar type, the invention is not limited to such a diode but is applicable also to all types of semiconductor devices in which an electrode is provided in the N-type high concentration surface layer through a metal layer.

Lastly, it has been ascertained that according to the invention, the occurrence of substandard products is reduced to substantially zero as compared with approximately 10 to 30 percent in the conventional methods.

I claim:

1. A method of manufacturing semiconductor devices, comprising the steps:
    a. forming a plurality of N-type high concentration regions in an N-type region whose surface is exposed to a first main surface of a semiconductor wafer, said N-type region forming at least one PN junction with an adjacent P-type region, each of said N-type high concentration regions being remote from one another;
    b. forming a metal layer over the entirety of said first main surface of said N-type region to form ohmic contact with said N-type high concentration regions;
    c. scribing grooves on a second main surface opposite to said main surface in a manner that said grooves in two directions are perpendicularly arranged to form substantially squares in which each of said N-type high concentration regions is confined and is smaller than the square in area so that each of said N-type high concentration regions is surrounded by the N-type region;
    d. applying a masking tape to said metal layer;
    e. applying a pressure to said semiconductor wafer on said masking tape for cutting off complete semiconductor elements defined by said scribing grooves;
    f. applying tension to said masking tape; and
    g. separating said complete semiconductor elements from said masking tape.

2. A method according to claim 1 in which the impurity concentration of said N-type wafer is approximately $1 \times 10^{15}$ atoms/cm$^3$ and the impurity concentration of said N-type high concentration regions is $1 \times 10^{18}$ to $1 \times 10^{20}$ atoms/cm$^3$.

3. A method according to claim 1 in which each of said N-type high concentration regions is formed in such a manner that the widths of the portion of said N-type wafer viewed on said first main surface are larger at every corner of said square than at the other portions.

4. A method of manufacturing semiconductor devices, comprising the steps of:
   a. forming an N-type high concentration region in an N-type region of a semiconductor wafer in a manner that a plurality of surfaces of said N-type region which are remote from one another are exposed to a first main surface of said semiconductor wafer, said N-type region forming at least one PN junction with an adjacent P-type region;
   b. forming a metal layer over the entirety of said first main surface of said N-type region to form ohmic contact with said N-type high concentration region;
   c. scribing grooves on a second main surface opposite to said main surface in a manner that said grooves in two directions are perpendicularly arranged to form substantially squares so that each of said N-type regions at said first main surface of said semiconductor wafer is divided into four fan-shaped portions and each fan shape portion being one of the four corners of said square;
   d. applying a masking tape to said metal layer;
   e. applying a pressure to said semiconductor wafer on said masking tape for cutting off complete semiconductor elements defined by said scribing grooves;
   f. applying tension to said masking tape; and
   g. separating said complete semiconductor elements from said masking tape.

5. A method of according to claim 4 in which the impurity concentration of said N-type wafer is approximately $1 \times 10^{15}$ atoms/cm$^3$ and impurity concentration of said N-type high concentration region is $1 \times 10^{18}$ to $1 \times 10^{20}$ atoms/cm$^3$.

* * * * *